(12) United States Patent
Laroche

(10) Patent No.: US 7,909,649 B2
(45) Date of Patent: Mar. 22, 2011

(54) CONNECTION DEVICE FOR LOCAL AREA NETWORK

(75) Inventor: Vincent Laroche, Saint-Marcellin (FR)

(73) Assignees: Legrand France, Limoges (FR); Legrand SNC, Limoges (FR)

( * ) Notice: Subject to any disclaimer, the term of this patent is extended or adjusted under 35 U.S.C. 154(b) by 85 days.

(21) Appl. No.: 12/444,853

(22) PCT Filed: Oct. 5, 2007

(86) PCT No.: PCT/FR2007/001630
§ 371 (c)(1),
(2), (4) Date: Apr. 9, 2009

(87) PCT Pub. No.: WO2008/043902
PCT Pub. Date: Apr. 17, 2008

(65) Prior Publication Data
US 2010/0167587 A1    Jul. 1, 2010

(30) Foreign Application Priority Data
Oct. 9, 2006  (FR) ...................................... 06 54161

(51) Int. Cl.
*H01R 13/66* (2006.01)
(52) U.S. Cl. .......... 439/620.22; 439/620.21; 439/620.23
(58) Field of Classification Search .................... 439/620.21–620.25, 676, 638, 439/76.1
See application file for complete search history.

(56) References Cited

U.S. PATENT DOCUMENTS

| 4,726,638 | A | * | 2/1988 | Farrar et al. | ............... | 439/620.16 |
|---|---|---|---|---|---|---|
| 4,799,901 | A | | 1/1989 | Pirc | | |
| 5,299,956 | A | * | 4/1994 | Brownell et al. | ............. | 439/638 |
| 5,414,393 | A | * | 5/1995 | Rose et al. | .......................... | 333/1 |
| 5,474,474 | A | * | 12/1995 | Siemon et al. | ........... | 439/620.22 |
| 6,758,698 | B1 | | 7/2004 | Caveney et al. | | |
| 7,182,649 | B2 | * | 2/2007 | Caveney et al. | ............... | 439/676 |
| 7,387,538 | B2 | * | 6/2008 | Engel et al. | ............... | 439/620.23 |
| 7,695,307 | B2 | * | 4/2010 | Mossner et al. | ............... | 439/404 |
| 2008/0009194 | A1 | * | 1/2008 | Biddle et al. | ............. | 439/620.21 |
| 2008/0259517 | A1 | | 10/2008 | Kotze et al. | | |

FOREIGN PATENT DOCUMENTS

FR   2 729 510   7/1996
WO   2005/093911   10/2005

OTHER PUBLICATIONS

International Search Report dated Mar. 3, 2008, from corresponding PCT application.

* cited by examiner

*Primary Examiner* — Michael C Zarroli
(74) *Attorney, Agent, or Firm* — Young & Thompson

(57) ABSTRACT

This device includes two connection units and a compensation circuit provided with tracks (4D, 6D) for connecting these units and with capacitive coupling between at least two of the tracks, including a conductor element (36) exhibiting a surface (49) including a portion opposite a surface of a section of a first of the tracks (4D) and another opposite a section of the second of the tracks (6D) with the conductor element (36) which is electrically insulated from the two tracks (4D, 6D).

20 Claims, 5 Drawing Sheets

CONNECTION DEVICE FOR LOCAL AREA NETWORK

FIELD OF THE INVENTION

The invention relates to cable local area network connection devices.

TECHNOLOGICAL BACKGROUND

It is known that local area network cables are generally of the type with four twisted pairs of conductors and that the female sockets and the male plugs employed for the connection of such cables include a series of eight metal contacts arranged in a predetermined fashion, most often conforming to the RJ45 format.

It is also known that the geometry of the contacts present in such plugs and in such sockets is not optimal from the electrical transmission point of view and that in particular the disposition of the four pairs of contacts within a single connection unit, with no ground separation, encourages unwanted coupling between the various pairs (known as crosstalk), while the geometry of the contacts is not adapted to the usual characteristic impedance of local area networks, namely 100 ohms, which produces impedance matching faults and therefore high insertion losses.

In order to counterbalance this unwanted coupling and to improve impedance matching, local area network connection devices generally include a compensation circuit between the two connection units formed for example by the contacts of an RJ45 female socket and the terminal block connected to a local area network cable.

This compensation circuit is generally produced in the form of a rigid printed circuit, often including two layers, or even more layers in the case of high-performance sockets.

Such a compensation circuit produces inductive and capacitive coupling, forming an LC cell or a plurality of LC cells in cascade.

The inductive coupling (magnetic coupling or predominantly inductive effect) is produced by the proximity of two wires. The distance that separates them, their dimensions, the materials used for the wires and their supports determine the coupling obtained.

Like inductive coupling, capacitive coupling (electrical coupling or predominantly capacitive effect) is produced by the proximity of two conductors, but it is coupling between the surfaces of these conductors that is required. Capacitive coupling is conventionally produced by comb-shaped capacitors disposed on the same layer of the circuit or through-plated-holes produced through the thickness of the circuit.

One example of a local area network connection device provided with such a compensation circuit is described in French patent application 2 729 510, for example.

OBJECT OF THE INVENTION

The invention aims to provide such a connection device that combines transmission performance with being simple and economical.

To this end it proposes a local area network connection device, including two connection units and a compensation circuit provided with connection points for contacts of said connection units and conductive tracks for connecting said connection points two-by-two, said circuit including capacitive coupling means between at least a first of said conductive tracks and a second of said conductive tracks; characterized in that said capacitive coupling means include a conductive element electrically insulated from said first track and said second track while it features a surface including a portion facing, through a dielectric, a surface with the same orientation of a section of the first track and another portion facing, through said dielectric, a surface with the same orientation of a section of the second track.

Because the conductive element is not connected to any of the tracks to be coupled, the stray components intrinsic to capacitive coupling are weak, which enables the connection device of the invention to offer good transmission performance while the compensation circuit that it includes remains simple and economic to produce.

According to preferred features, said dielectric includes a substrate disposed between said conductive element and said first track and said second track.

Such a substrate is particularly convenient for producing the compensation circuit, especially for carrying the conductive tracks and/or the conductive element.

According to other preferred features, said dielectric includes a flexible film material.

Such a material is generally thin and has a low thickness tolerance.

It is therefore particularly advantageous for producing the capacitive coupling means of the invention, given that the precision of such coupling depends on the tolerance on the thickness of dielectric between the conductive tracks and the surface of the conductive element and that the smaller this thickness the more efficient the coupling.

For reasons of simplicity and convenience of implementation, said flexible film material is conformed as a strip.

According to other features preferred for reasons of simplicity and convenience of implementation:
  said section of the first track and said section of the second track take the form of a ribbon;
  said section of the first track and said section of the second track are parallel to each other with their internal longitudinal edges which are directly facing each other;
  said section of the first track and said section of the second track are disposed in a comb-like manner, with said first track and said second track each having teeth disposed in an interleaved manner;
  said conductive element is a block including a main face forming said surface;
  said block is rectangular;
  said conductive element is a screw said surface of which is situated at one end;
  said device includes a portion forming a nut in which is received the shank of said screw, thanks to which the distance between said end surface and said first conductive track and said second conductive track can be adjusted;
  said compensation circuit includes a central part which is flexible and two end parts which are rigid;
  said connection points are provided in said end parts;
  at least one of said connection units is a connection unit for an RJ45 female socket;
  said two connection units are connection units for an RJ45 female socket;
  the device includes at least one receptacle for receiving an RJ45 male plug; and/or
  the device includes two receptacles for receiving an RJ45 male plug respectively opening onto one and the other of two opposite faces of a casing.

BRIEF DESCRIPTION OF THE DRAWINGS

The description of the invention will now continue with the detailed description of embodiments given hereinafter by way of illustrative and nonlimiting example, with reference to the appended drawings, in which.

DETAILED DESCRIPTION OF EMBODIMENTS

Figure 1:
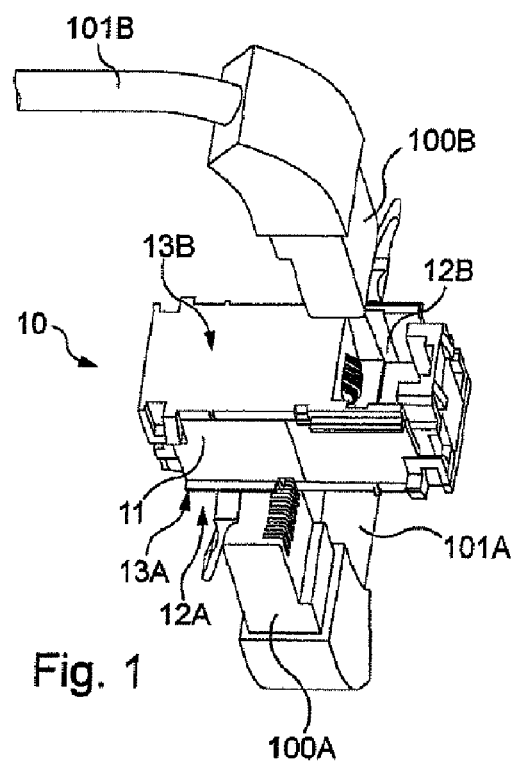
FIG. 1 is a perspective view showing a connection device of the invention including two RJ45 female sockets connected to each other and two RJ45 male plugs each disposed in front of a respective receiving receptacle of this device, in a position in which it is ready to be inserted therein.
Figure 2:
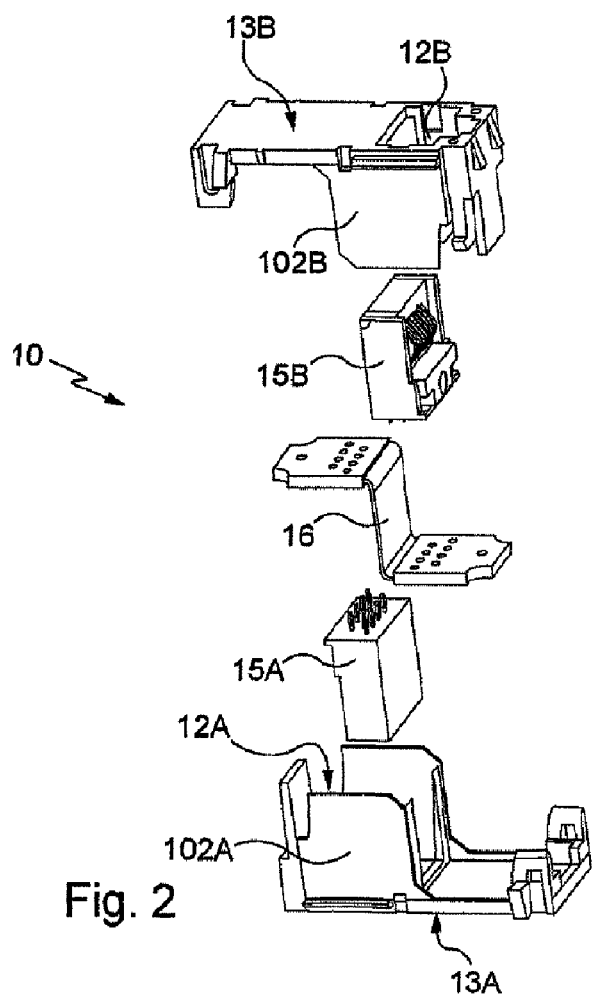
FIG. 2 is an exploded perspective view of this connection device.

The connection device 10 shown in FIGS. 1 and 2 includes a casing 11 featuring two receptacles 12A and 12B for receiving an RJ45 male plug such as the plugs 100A and 100B represented in FIG. 1, each situated at an end of a local area network cable, respectively 101A and 101B.

When plugs like the plugs 100A and 100B are inserted into the receptacles 12A and 12B, respectively, the cables such as 100A and 100B are connected together.

The receptacles 12A and 12B respectively open onto opposite faces 13A and 13B of the casing 11.

Here the casing 11 includes two shells 102A and 102B (FIG. 2) which are identical and disposed head-to-tail. The shells 102A and 102B are snap-fastened together.

Figure 3:
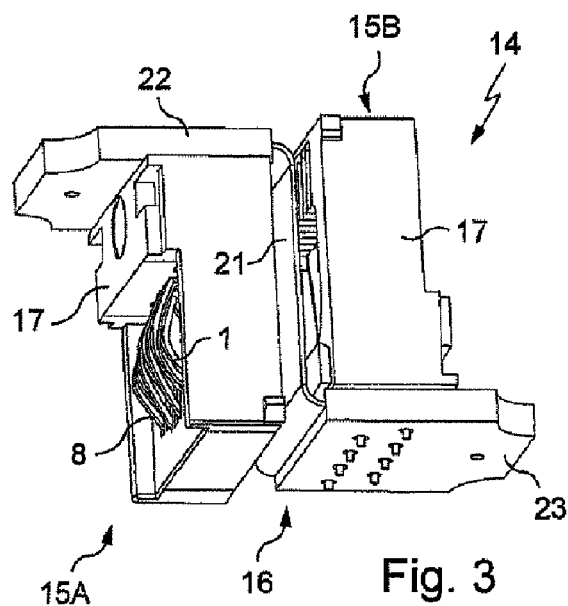
FIG. 3 is a perspective view of an assembly forming part of the device shown in FIG. 1, this assembly including two connection units for RJ45 female sockets and a compensation circuit connecting these two units to each other.

The receptacle 11 encloses an assembly 14 shown in the assembled state in FIG. 3.

The assembly 14 includes two connection units 15A and 15B adapted to form part of an RJ45 female socket, these two units being identical, disposed head-to-tail and connected to each other by a compensation circuit 16.

Figure 4:
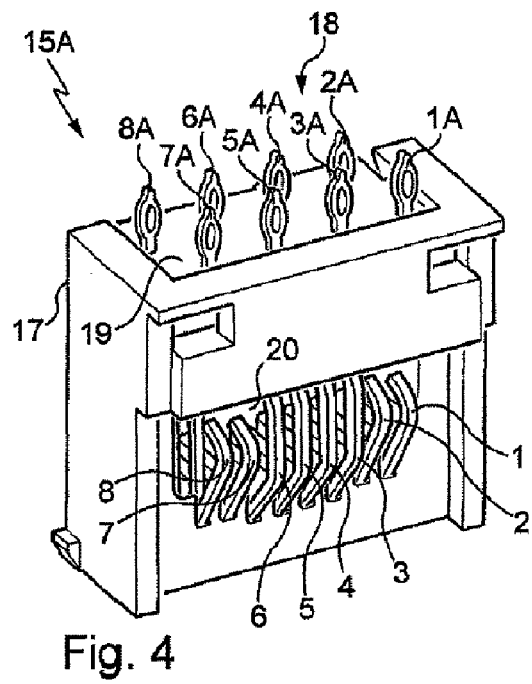
FIG. 4 is a perspective view showing one of the connection units in isolation.

The connection unit 15A will be described next with more particular reference to FIG. 4. This description is equally valid for the connection unit 15B, which is identical.

The connection unit 15A includes an insulative support 17 in which is disposed an insert 18 which includes an insulative board 19 carrying eight metal contacts 1 to 8. The numerical references 1 to 8 are here identical to the standardized numbering scheme for the contacts of RJ45 connection units.

Each of the metal contacts 1 to 8 includes a contact part disposed in a window 20 of the support 17 and a respective lead 1A, 2A, 3A, 4B, 5A, 6A, 7B and 8A projecting from the board 19 on the side opposite the window 20.

Each contact part disposed in the window 20 is provided to make electrical contact with the corresponding metal contact of an RJ45 male plug such as 100A or 100B introduced into the receptacle 12A (12B in the case of the connection unit 15B).

The unit 15A is mounted in the device 10 by clipping the support 17 to the receptacle 11, to be more precise to the shell 102A (102B for the connection unit 15B), at the level of the receptacle 12A (12B in the case of the connection unit 15B).

Each of the leads 1A to 8A connects the metal contact to which it belongs to the rest of the device 10.

Here the leads have a pinhead shape and each can be forcibly introduced into a connection hole of a rigid printed circuit board.

For more details of the connection units 15A and 15B, see French patent application 2 826 788.

Figure 5:
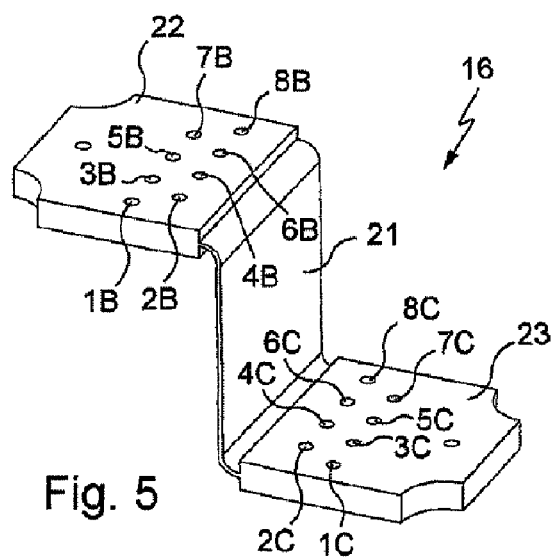
FIG. 5 is a perspective view showing the compensation circuit in isolation.

The compensation circuit 16, shown in isolation in FIG. 5, includes a central part 21 that is flexible and two end parts 22 and 23 that are rigid.

The rigid part 22 includes eight connection holes 1B, 2B, 3B, 4B, 5B, 6B, 7B and 8B to receive the leads 1A, 2A, 3A, 4A, 5A, 6A, 7A and 8A, respectively, of the connection unit 15A.

Similarly, the rigid end part 23 includes eight connection holes 1C, 2C, 3C, 4C, 5C, 6C, 7C and 8C to receive the leads 1A, 2A, 3A, 4A, 5A, 6A, 7A and 8A, respectively, of the connection unit 15B.

Figure 6:
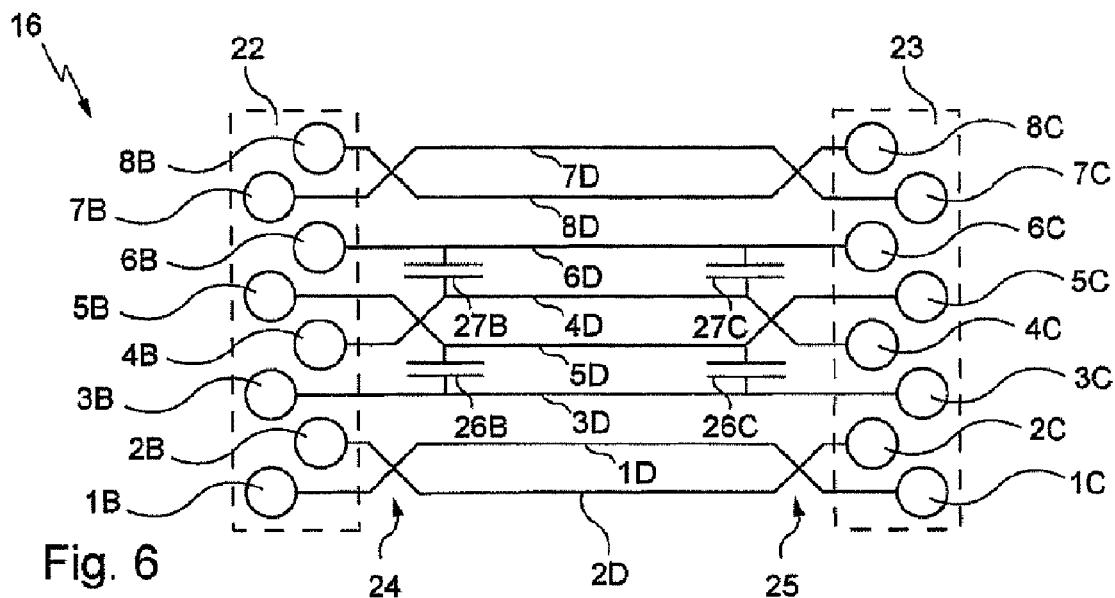
FIG. 6 is a simplified electrical circuit diagram of the compensation circuit.

The connections made by the compensation circuit 16 are shown diagrammatically and in a simplified manner in FIG. 6.

The circuit 16 includes eight conductive tracks 1D, 2D, 3D, 4D, 5D, 6D, 7D and 8D. The track 1D connects the connection hole 1B of the end part 22 to the connection hole 1C of the end part 23. The holes 2B and 2C are connected to each other by the track 2D, and so on, the holes xB and xC being connected to each other by the track xD, with x running from 1 to 8.

It is seen that the tracks 1D and 2D cross over with a first crossing zone 24 near the connection holes 1B and 2B and a second crossing zone 25 near the connection holes 1C and 2C.

The pair of tracks 4D, 5D and the pair of tracks 7D, 8D cross in the same manner.

On the other hand, the tracks 3D and 6D do not cross any other track.

According to the standard wiring of RJ45 connection units, the contacts 1 to 8 are connected to a cable, such as 101A and 101B, with eight conductors disposed in four twisted pairs terminating at the contact pairs 1-2, 3-6, 4-5 and 7-8, respectively.

The crossing of the pairs of conductive tracks 1D-2D, 4D-5D and 7D-8D produces an effect similar to that of twisting the pairs of conductors in the cable.

Such crossing of the tracks 3D and 6D is not possible, because the holes 3B and 6B (respectively 3C and 6C) are not adjacent.

To improve the transmission performance of the device 10, especially the impedance matching of the pair 3-6 and the crosstalk between the pair 3-6 and the pair 4-5, capacitive coupling is provided between the tracks 3D and 5D and between the tracks 4D and 6D.

The capacitive coupling between the tracks 3D and 5D is produced by two capacitors 26B and 26C.

The capacitor 26B is disposed between the conductive tracks 3D and 5D near the connection holes 3B and 4B. Similarly, the capacitor 26C is disposed between the conductive tracks 3D and 5D near the connection holes 3C and 4C.

It will be seen that each of the capacitors 26B and 26C is disposed in an area in which, thanks to crossing the track 4D, the conductive track 5D is disposed facing and near the track 3D.

The capacitive coupling between the tracks 4D and 6D is also produced by two capacitors 27B and 27C, disposed in a similar fashion.

Accordingly, the capacitor 27B is disposed between the conductive tracks 4D and 6D near the connection holes 5B and 6B and the capacitor 27C is disposed between the conductive tracks 4D and 6D near the connection holes 5C and 6C, with each of the capacitors 27B and 27C which is disposed between the conductive tracks 4D and 6D in an area in which, thanks to the crossing of the tracks 4D and 5D, the track 4D is facing and near the conductive track 6D.

The different layers that compose the compensation circuit 16 will be described next with the assistance of FIGS. 7 to 10.

Figure 7:
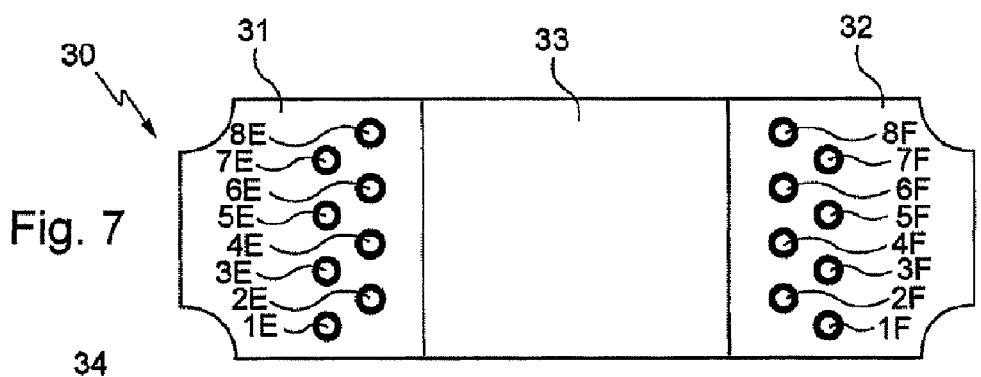
FIG. 7 is a diagrammatic plan view of one of the two external layers of the compensation circuit.

The circuit 16 includes two external layers 30 shown in isolation in FIG. 7.

Each layer 30 includes two printed circuit boards 31 and 32 and, disposed between the boards 31 and 32, a strip 33 of flexible thin-film insulative material.

The printed circuit boards 31 and 32 are part of the rigid end part 22 and the rigid end part 23, respectively. The strip 33 is part of the central flexible part 21.

Through-plated-holes 1E, 2E, 3E, 4E, 5E, 6E, 7E and 8E in the board 31 constitute the connection holes 1B to 8B, respectively.

Similarly, the printed circuit board 32 has through-plated-holes 1F, 2F, 3F, 4F, 5F, 6F, 7F and 8F constituting the connection holes 1C to 8C, respectively.

Figure 8:
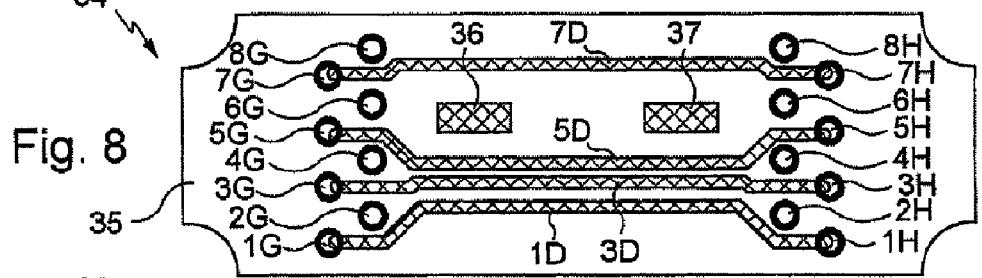
FIGS. 8 and 9 are similar views for two respective internal layers of the compensation circuit.

The first internal layer 34 shown in FIG. 8 includes a strip 35 of flexible thin-film insulative material forming a substrate on which are disposed the conductive tracks 1D, 3D, 5D and 7D and two conductive blocks 36 and 37, here of rectangular shape.

In the substrate 35 there are formed at one end through-plated-holes 1G, 2G, 3G, 4G, 5G, 6G, 7G and 8G to provide the connection holes 1B to 8B, respectively. At the other end there are formed through-plated-holes 1H, 2H, 3H, 4H, 5H, 6H, 7H and 8H, providing the connection holes 1C to 8C, respectively.

Of course, the track 1D is disposed between the holes 1G and 1H, the track 3D between the holes 3G and 3H, the track 5D between the holes 3G and 3H, and, finally, the track 7D between the holes 7G and 7H.

The conductive blocks 36 and 37 have a disposition similar to that of the capacitors 27B and 27C.

Accordingly, the block 36 is disposed near the holes 5G and 6G and the block 37 is disposed near the holes 5H and 6H.

Figure 9:
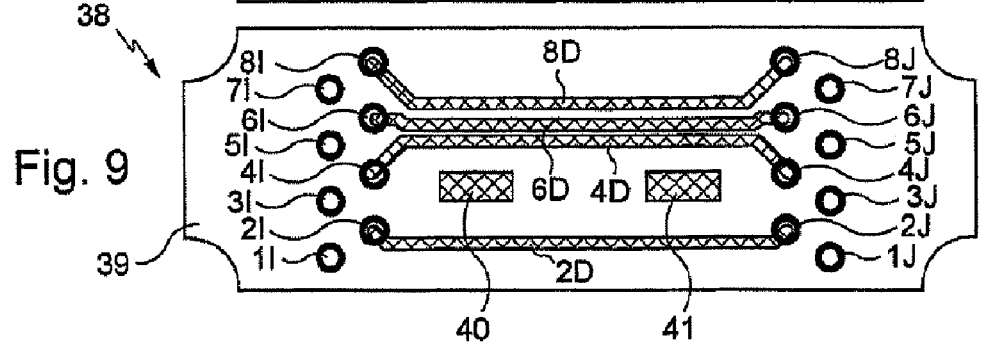

The second internal layer 38 shown in FIG. 9 includes a strip 39 of flexible thin-film insulative material forming a substrate on which are disposed the conductive tracks 2D, 4D, 6D and 8D and two conductive blocks 40 and 41, here of rectangular shape.

In the substrate 39 there are formed at one end through-plated-holes 1I, 2I, 3I, 4I, 5I, 6I, 7I and 8I to provide the connection holes 1B to 8B, respectively. At the other end there are formed through-plated-holes 1J, 2J, 3J, 4J, 5J, 6J, 7J and 8J to provide the connection holes 1C to 8C, respectively.

Of course, the track 2D is disposed between the holes 2I and 2J, the track 4D is disposed between the holes 4I and 4J, the track 6D is disposed between the holes 6I and 6G, and, finally, the track 8D is disposed between the holes 8I and 8J.

The conductive blocks 40 and 41 have a disposition similar to that of the capacitors 26B and 26C.

Accordingly, the block 40 is disposed near the holes 3I and 4I and the block 41 is disposed near the holes 3J and 4J.

It will be noted that, generally speaking, the external holes (odd numbers) are connected by conductive tracks carried by the substrate 35 and the internal holes (even numbers) are connected by conductive tracks carried by the substrate 39.

In the compensation circuit 16, the internal layers 34 and 38 are disposed one against the other so that the different through-plated-holes are superposed exactly (the hole 1I is superposed on the hole 1G, the hole 2I on the hole 2G and so on and, likewise the hole 1J is superposed on the hole 1H, the hole 2H on the hole 2J, and so on).

The conductive tracks 1D to 8D are therefore arranged as described with the aid of FIG. 6.

Of course, the insulative character of the substrate 35 prevents short circuits between the conductive tracks that cross, each track crossing another track being disposed on a distinct layer.

One of the external layers 30 is disposed against the layer 34, on the side opposite the layer 38, and the other external layer 30 is disposed against the layer 38, on the side opposite the layer 34. The through-plated-holes 1E are superposed on the through-plated-holes 1G and 1I, the through-plated-holes 2E are superposed on the through-plated-holes 2I and 2G, and so on; similarly, the through-plated-holes 1F are superposed on the through-plated-holes 1H and 1J, the through-plated-holes 2F are superposed on the through-plated-holes 2J and 2H, and so on.

The external layers 30 mechanically reinforce the internal layers 34 and 38 and, moreover, the external layer 30 disposed against the layer 34 electrically insulates the latter from the exterior, except of course at the connection points that the holes 1B to 8B and 1C to 8C constitute.

As indicated hereinabove, the rigid character of the printed circuit boards 31 and 32 enables forcible insertion of the deformable leads 1A to 8A in the end parts 22 and 23 of the compensation circuit 16, the units 15A and 15B thus being connectable to the circuit 16 without soldering.

Of course, it is possible, as an alternative, to effect a connection by soldering.

The flexible character of the central part 21 facilitates disposing the connection units 15A and 15B head-to-tail.

The relative arrangement of the block 36 and the conductive tracks 4D and 6D will be more particularly described next with the aid of FIG. 10.

The conductive tracks 4D and 6D, disposed on the substrate 39 (not represented in FIG. 10), each take the form of a constant width ribbon. In other words, the distance between the two longitudinal edges 45 and 46 of each of the tracks 5D and 6D is constant.

Here, the tracks 4D and 6D are the same width.

In the vicinity of the block 36, the tracks 4D and 6D are parallel to each other with their longitudinal internal edges 45 which are directly facing each other.

The block 36 here has a rectangular shape with a width (distance separating its longer sides 47) that is substantially equal to the distance separating the external longitudinal edges 46 of the conductors 4D and 6D.

The main face 49 of the block 36 on the same side as the substrate 35 thus constitutes a surface including a portion which, through the dielectric that the substrate 35 constitutes, faces a surface with the same orientation of a section of the conductive track 4D, the surface that the face 49 forms also including another portion that, through the substrate 35, faces a surface with the same orientation of a section of the conductive track 6D.

The block 36 being electrically insulated from the conductive tracks 4D and 6D by the substrate 35, the conductive block 36 reduces the electric field lines that link these two conductors, which, at the block 36, produces a capacitive effect between the tracks 4D and 6D.

This produces the capacitor referenced 27B in FIG. 5.

The capacitor 27C, also disposed between the conductive tracks 4D and 6D, is produced in a similar fashion by the conductive block 37, the relative arrangement of the block 37 and the tracks 4D and 6D being identical to the relative arrangement of the block 36 and the tracks 4D and 6D.

The capacitors 26B and 26C coupling the conductive tracks 3D and 5D are also produced in a similar fashion thanks to the conductive blocks 40 and 41, the relative arrangement of the conductive tracks 3D, 5D and the block 40 (respectively 41) being similar to the relative arrangement of the tracks 4D and 6D and the conductive block 36.

It will be noted that the conventional solution for producing the capacitive coupling between the tracks 3D and 5D and between the tracks 4D and 6D would have been to employ conductive tracks disposed in a comb-like arrangement on the printed circuit boards such as 31 and 32.

To be more precise, a capacitor formed of two comb-shaped conductors would be disposed, on the distal side (i.e. opposite the conductive tracks), on one of the layers such as 30 between the through-plated-holes 3E and 5E of the printed circuit such as 31 and between the through-plated-holes 4F and 6F of the printed circuit such as 32, and, on the other layer 30, between the through-plated-holes 4E and 6E of the printed circuit such as 31 and between the through-plated-holes 3F and 5F of the printed circuit such as 32.

Compared to this conventional solution, producing the coupling with conductive blocks such as 36, 37, 40 and 41 offers the advantage of effecting the capacitive coupling with no connection to the tracks to be coupled and therefore with a conductive area of smaller dimensions.

Because of this reduction of dimensions, the stray components intrinsic to the capacitive coupling are weaker and consequently the coupling obtained is more efficient, so that the connection device 10 offers better transmission performance, in particular for the impedance matching of the pair 3-6 and the crosstalk between the pair 3-6 and the pair 4-5.

As indicated hereinabove, the electrical circuit diagram shown in FIG. 6 is particularly simplified. To clarify the description, only the capacitive coupling between the conductors 3D and 5D, on the one hand, and between the conductors 4D and 6D, on the other hand, is shown.

In reality, the resulting coupling between the different conductors 1D to 8D is much more complex, in particular with an inductive component between the different conductive tracks disposed parallel and near each other.

Figure 10:
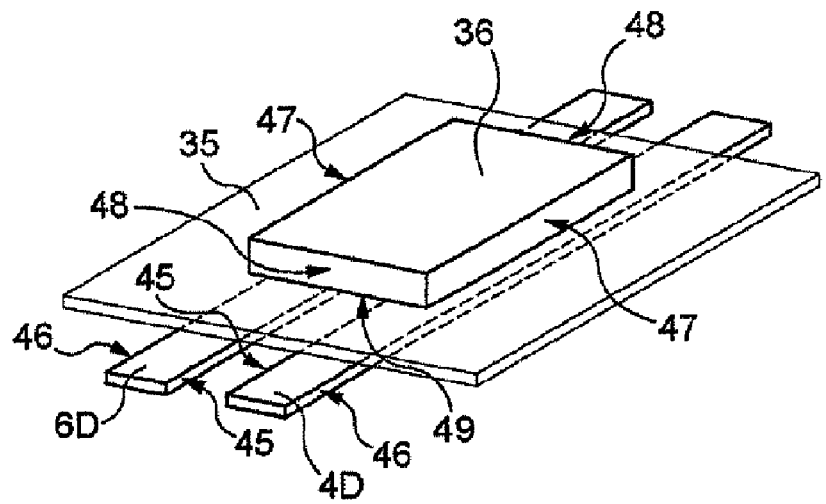
FIG. 10 is a diagrammatic perspective view showing a portion of the compensation circuit.
Figure 11:
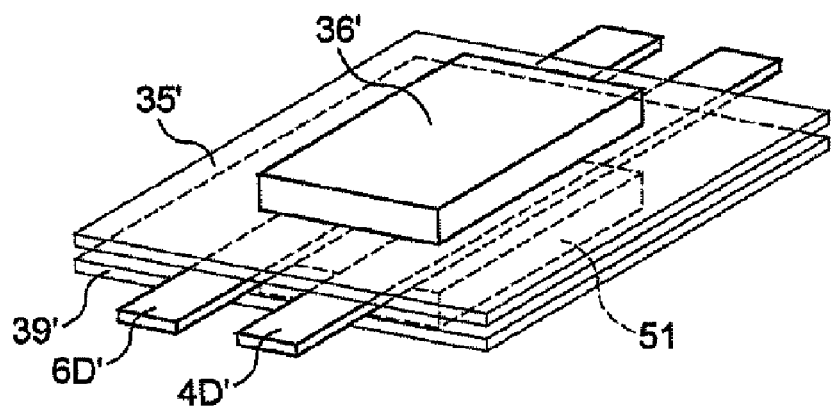
FIGS. 11 and 13 are similar views but for variants of the compensation circuit.

FIG. 11 shows a variant of the portion of the compensation circuit 16 shown in FIG. 10. The same numerical references have been retained for similar items, but with the addition of the prime symbol (').

The conductive tracks 4D' and 6D', the substrate 35' and the block 36' are exactly identical to the conductive tracks 4D and 6D, the substrate 35 and the conductive block 36.

There is moreover provided on the opposite side of the substrate 39' to the conductive tracks 4D' and 6D' a conductive block 51 similar to the block 36' and symmetrically disposed relative thereto.

Accordingly, like the conductive block 36', the conductive block 51 features a surface including a portion which, through the dielectric that the substrate 39' constitutes, faces a surface with the same orientation of a section of the track 4D' and a portion which, through the dielectric that the substrate 39' constitutes, faces a surface with the same orientation of a section of the track 6D', with the block 51 which is electrically insulated from the tracks 4D' and 6D', so that the block 51 produces capacitive coupling at the same time as the conductive block 36', the overall capacitive coupling therefore being greater than with the conductive block 36 alone.

Figure 12:
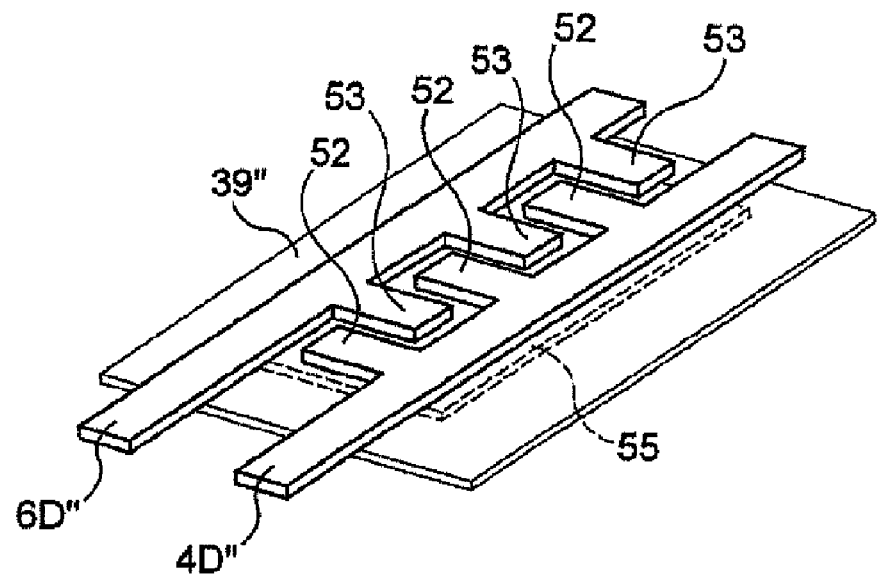
FIG. 12 shows another variant of the portion of the coupling circuit 16 shown in FIG. 10.

FIG. 12 shows another variant of the portion of the coupling circuit 16 shown in FIG. 10. The same numerical references have been retained for similar items, but with the addition of the double prime symbol (").

The conductive tracks 4D" and 6D" are disposed in a comb-like fashion, here with each of the tracks 4D" and 6D" that include teeth, respectively 52 and 53, projecting in the direction of the other track, these teeth being disposed in an interleaved fashion.

On the opposite side of the substrate 39" to the conductive tracks 4D" and 6D" there is provided a conductive block 55 the dimensions of which are such that its surface facing toward the substrate 39" faces, through the dielectric that the substrate 39" constitutes, the entirety of the surfaces with the same orientation of the tracks 4D" and 6D", in the area in which the teeth 52 and 53 are provided.

Accordingly, the surface facing toward the substrate 39" includes a portion that, through the substrate 39", faces a surface with the same orientation of a section of the track 4D" and a portion which, under the same conditions, faces a surface with the same orientation of a section of the track 6D".

The block 55 being electrically insulated from each of the conductive tracks 4D" and 6D", it produces capacitive coupling between the tracks 4D" and 6D", which is added to the capacitive coupling produced by the comb-like disposition of these conductive tracks.

Figure 13:
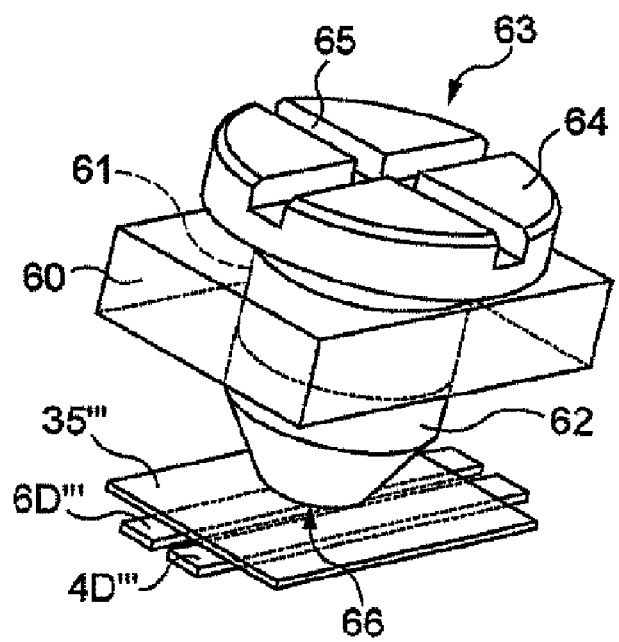

FIG. 13 shows another variant of the portion of the coupling circuit 16 shown in FIG. 10. The same numerical references are retained for similar items, but with the addition of the triple prime symbol ("').

It is pointed out that in the variant shown in FIG. 13 there exists in the casing such as 11 more space around the compensation circuit such as 16, this casing including a portion 60 forming a nut and a support (not shown) enabling the conductive tracks 4D"' and 6D"' to be disposed in a predetermined fashion relative to the part 60.

The latter includes a threaded bore 61 in which the threaded shank 62 of a screw 63 is engaged.

The head 64 of the screw 63 includes an imprint 65 for controlling the angular position of the screw 63 relative to the part 60.

The end surface 66 of the screw 63 is disposed in line with the conductive tracks 4D"' and 6D"', the substrate 35"' and the air gap situated between the surface 66 and the substrate 35"' constituting a dielectric.

Through this dielectric, a portion of the surface 66 faces a surface with the same orientation of a section of the track 4D"' and another portion of the surface 66, through this dielectric, faces a surface with the same orientation of a section of the conductive track 6D"'.

Being electrically insulated from the tracks 4D"' and 6D"', the screw 63 produces a capacitive coupling between these tracks.

Varying the angular position of the screw 63 varies the thickness of the air gap between the substrate 35"' and the surface 66.

This varies the value of the capacitive coupling produced. This enables fine adjustment of this capacitive coupling.

It will be noted that, thanks to blocks of conductive material such as the blocks 36, 37, 40 and 41, it is equally possible to produce a fine adjustment of the capacitive coupling values by adjusting the dimensions of those blocks, for example by volatilization using a laser beam.

It will be observed that such volatilization, because it is effected on an element that does not serve for the direct routing of an electric current, does not produce any restriction on the current routing section.

In a variant which is not shown, the conformation of the two conductive tracks to be coupled capacitively and/or the conformation of the conductive element(s) is again different, for example with the conductive tracks which feature changes of direction and the conductive block which is electrically insulated from the two conductive tracks and which features steps, with each time the conductive element that features a surface including a portion facing, through a dielectric, a surface of a section of one conductive track and another portion facing, through a dielectric, a surface of a section of the other conductive track.

In another variant that is not shown, the conductive element is produced differently from a conductive block disposed on a substrate or from a screw the end surface of which faces the conductive tracks.

It will be noted that the accuracy of the capacitive coupling produced depends on the tolerance on the thickness of dielectric between the conductive tracks and the surface of the conductive element and that the smaller this thickness the more efficient the coupling.

It is thus advantageous to use a flexible circuit, and more precisely a substrate such as 35, 35', 39" or 35''', of very small thickness (25 or 50 μm) and with a small thickness tolerance (of the order of 2%).

Of course, it is possible to produce capacitive coupling with conductive blocks such as 36, 37, 40 and 41 for other portions of a compensation circuit such as 16.

In other variants that are not shown, the compensation circuit is produced differently, for example with double-sided layers rather than single-sided layers, entirely rigid or entirely flexible, and/or produced by multilayer screenprinting or overmolding multiple strips.

In further variants that are not shown, the connection units connected by the compensation circuit are of a different type, for example a unit such as 15A or 15B and a connection block connected to a wall-mounted cable, two terminal blocks connected to such a cable, and/or at least one connection unit to another format such as RJ12 or Sub-D.

Numerous other variants are possible as a function of circumstances, and in this connection it is pointed out that the invention is not limited to the examples described and represented.

The invention claimed is:

1. A local area network connection device, comprising:
   two connection units (15A, 15B); and
   a compensation circuit (16) provided with connection points (1B-8B, 1C-8C) for contacts (1A-8A) of said connection units (15A, 15B) and conductive tracks (1D-8D) for connecting said connection points two-by-two, said circuit (16) including capacitive coupling means between at least a first of said conductive tracks (3D, 4D; 4D'; 4D"; 4D''') and a second of said conductive tracks (5D, 6D; 6D'; 6D"; 6D'''),
   wherein said capacitive coupling means include a conductive element (36, 37, 40, 41; 36', 51; 55; 63) electrically insulated from said first track (3D, 4D; 4D'; 4D"; 4D''') and said second track (5D, 6D; 6D'; 6D"; 6D'''), and
   wherein said capacitive coupling means further include a surface (49; 66) including a first portion facing, through a dielectric (35; 35', 39'; 39"; 35'''), a first surface with a same orientation of a section of the first track, and a second portion facing, through said dielectric (35; 35', 39'; 39"; 35'''), a second surface with a same orientation of a section of the second track.

2. The device according to claim 1, wherein said dielectric includes a substrate (35; 35', 39'; 39"; 35''') disposed between said conductive element (36, 37, 40, 41; 36', 51; 55; 63) and said first track (3D, 4D; 4D'; 4D"; 4D''') and said second track (5D, 6D; 6D'; 6D"; 6D''').

3. The device according to claim 1, wherein said dielectric includes a flexible film material (35; 35', 39'; 39"; 35''').

4. The device according to claim 3, wherein said flexible film material (35; 35', 39'; 39"; 35''') is conformed as a strip.

5. The device according to claim 1, wherein said section of the first track (3D, 4D; 4D'; 4D''') and said section of the second track (5D, 6D; 6D'; 6D"; 6D''') take the form of a ribbon.

6. The device according to claim 5, wherein said section of the first track (3D, 4D; 4D'; 4D''') and said section of the second track (5D, 6D; 6D'; 6D"; 6D''') are parallel to each other with their internal longitudinal edges (45) which are directly facing each other.

7. The device according to claim 1, wherein said section of the first track (4D") and said section of the second track (6D") are disposed in a comb-like manner, with said first track (4D") and said second track (6D") each having teeth (52, 53) disposed in an interleaved manner.

8. The device according to claim 1, wherein said conductive element is a block (36, 37, 40, 41; 36', 51; 55) including a main face (49) forming said surface.

9. The device according to claim 8, wherein said block (36, 37, 40, 41; 36', 51; 55) is rectangular.

10. The device according to claim 1, wherein said conductive element is a screw (63) said surface (66) of which is situated at one end.

11. The device according to claim 10, further comprising:
    a portion (60) forming a nut in which is received the shank (62) of said screw (63), thanks to which the distance between said end surface (66) and said first conductive track (4D''') and said second conductive track (6D''') can be adjusted.

12. The device according to claim 1, wherein said circuit (16) includes a central part (21) which is flexible and two end parts (22, 23) which are rigid.

13. The device according to claim 12, wherein said connection points (1B-8B, 1C-8C) are provided in said end parts (22, 23).

14. The device according to claim 1, wherein at least one of said connection units is a connection unit (15A, 15B) for an RJ45 female socket.

15. The device according to claim 14, wherein said two connection units are connection units (15A, 15B) for an RJ45 female socket.

16. The device according to claim 1, further comprising:
    at least one receptacle (12A, 12B) for receiving an RJ45 male plug.

17. The device according to claim 16, further comprising:
    two receptacles (12A, 12B) for receiving an RJ45 male plug respectively opening onto one and the other of two opposite faces (13A, 13B) of a casing (11).

18. The device according to claim 2, wherein said dielectric includes a flexible film material (35; 35', 39'; 39"; 35''').

19. The device according to claim 2, wherein said section of the first track (3D, 4D; 4D'; 4D''') and said section of the second track (5D, 6D; 6D'; 6D"; 6D''') take the form of a ribbon.

20. The device according to claim 3, wherein said section of the first track (3D, 4D; 4D'; 4D''') and said section of the second track (5D, 6D; 6D'; 6D"; 6D''') take the form of a ribbon.

* * * * *